(12) United States Patent
Jeong et al.

(10) Patent No.: US 9,085,459 B2
(45) Date of Patent: *Jul. 21, 2015

(54) APPARATUS FOR MANUFACTURING QUANTUM DOT WITH A PLURALITY OF HEATING ZONES AND METHOD FOR MANUFACTURING QUANTUM DOT

(75) Inventors: Sohee Jeong, Daejeon-si (KR); Chang-soo Han, Daejeon-si (KR); Won-sik Seo, Daejeon-si (KR)

(73) Assignee: INTELLECTUAL DISCOVERY CO., LTD, Seoul (KR)

( * ) Notice: Subject to any disclaimer, the term of this patent is extended or adjusted under 35 U.S.C. 154(b) by 1097 days.

This patent is subject to a terminal disclaimer.

(21) Appl. No.: 13/126,300

(22) PCT Filed: Oct. 27, 2009

(86) PCT No.: PCT/KR2009/006226
§ 371 (c)(1),
(2), (4) Date: Jun. 1, 2011

(87) PCT Pub. No.: WO2010/050726
PCT Pub. Date: May 6, 2010

(65) Prior Publication Data
US 2011/0253032 A1 Oct. 20, 2011

(30) Foreign Application Priority Data
Oct. 27, 2008 (KR) ........................ 10-2008-0105368

(51) Int. Cl.
*B82Y 10/00* (2011.01)
*B82Y 40/00* (2011.01)
*H01L 21/67* (2006.01)

(52) U.S. Cl.
CPC ................. *B82Y 10/00* (2013.01); *B82Y 40/00* (2013.01); *H01L 21/67109* (2013.01); *Y10T 117/1024* (2015.01)

(58) Field of Classification Search
None
See application file for complete search history.

(56) References Cited

U.S. PATENT DOCUMENTS 6,179,912 B1 * 1/2001 Barbera-Guillem et al. ... 117/68
6,281,337 B1 * 8/2001 Cannon-Carlson et al. .. 530/402
(Continued)

FOREIGN PATENT DOCUMENTS

CN 101235546 A 8/2008
CN 201120278 Y 9/2008
(Continued)

OTHER PUBLICATIONS

Bessoth, Fiona G. et al "Microstructure for efficient continuous flow mixing" Anal. Commun., 1999, 36, 213-215, Jan. 1, 1999.*
(Continued)

*Primary Examiner* — Anita Alanko
(74) *Attorney, Agent, or Firm* — Fox Rothschild, LLP (57) ABSTRACT

Disclosed is a technology of producing quantum dots that are nano-size semiconducting crystals. A quantum dot producing apparatus includes a mixer for mixing precursor solutions, and a heating furnace with a plurality of heating areas providing different temperature conditions to heat the precursor mixture. Between the heating areas, a buffer may be installed which provides a low-temperature condition to prevent addition nucleation. Through this configuration, nucleation is separated from nuclear growth, uniformity in particle size of quantum dots is improved, which enables the mass-production of quantum dots, rather than a quantum dot producing apparatus with a single heating area that provides a constant temperature condition.

16 Claims, 11 Drawing Sheets

(56) References Cited

U.S. PATENT DOCUMENTS

| | | | |
|---|---|---|---|
| 6,682,596 B2 | 1/2004 | Zehnder et al. | 117/68 |
| 7,476,599 B2 * | 1/2009 | Wang et al. | 438/479 |
| 8,354,090 B2 * | 1/2013 | Han et al. | 423/509 |
| 8,540,939 B2 * | 9/2013 | Niesz et al. | 422/105 |
| 2004/0247517 A1 | 12/2004 | Zehnder et al. | |
| 2005/0129580 A1 * | 6/2005 | Swinehart et al. | 422/100 |
| 2007/0128350 A1 * | 6/2007 | Nakamura et al. | 427/157 |
| 2008/0245184 A1 * | 10/2008 | Lee et al. | 75/255 |
| 2009/0092526 A1 * | 4/2009 | Miller | 422/187 |
| 2011/0104043 A1 * | 5/2011 | Niesz et al. | 423/509 |
| 2011/0140046 A1 * | 6/2011 | Yu et al. | 252/301.36 |

FOREIGN PATENT DOCUMENTS

| | | | | |
|---|---|---|---|---|
| EP | 1772717 A1 | | 11/2007 | |
| JP | 2007-014849 A | | 1/2007 | |
| JP | 2007-069162 A | | 3/2007 | |
| JP | 2007-204298 A | | 8/2007 | |
| KR | 10-2006-0107695 A | | 10/2006 | |
| KR | 20080027642 A | * | 3/2008 | B82Y 10/00 |
| KR | 10-2008-0070101 A | | 7/2008 | |

OTHER PUBLICATIONS

Edel, Joshua B. et al. "Microfluidic Routes to the Controlled Production of Nanoparticles"; Chemical Communications; Issue 10, 2002; pp. 1136-1137.

Yang, Hongwei et al.; "Synthesis of Nanocrystals Via Microreaction with Temperature Gradient: Towards Separation of Nucleation and Growth"; Lab on a Chip; Issue 3, 2008; vol. 8; pp. 451-455.

PCT International Search Report dated May 31, 2010 issued in Application No. PCT/KR2009/006226.

Manabu Kawa, et al.; "Large-scale production of CdSe nanocrystal by a continuous flow reactor"; Journal of Nanoparticle Research; vol. 5, Jan. 1, 2003; pp. 81-85 (XP-55059538).

European Search Report dated Apr. 25, 2013 issued in Application No. 09 82 3806.

* cited by examiner

APPARATUS FOR MANUFACTURING QUANTUM DOT WITH A PLURALITY OF HEATING ZONES AND METHOD FOR MANUFACTURING QUANTUM DOT

TECHNICAL FIELD

The present invention relates to a technology of producing quantum dots that are nano-size semiconducting crystals.

BACKGROUND ART

Bulky quantum dots exhibit unique optical/electrical properties which no semiconducting materials show. Due to these unique properties, nano quantum dots are becoming of central interest as a material for next-generation high-brightness LEDs, biosensors, lasers, solar cells, etc. Conventionally, quantum dots have been produced mainly in laboratories in such a way to quickly inject cooled precursors into a high-temperature solvent to create nucleuses and then grow the nucleuses under the appropriate temperature conditions. However, the conventional method has limitations in respect to mass production of quantum dots, since it has poor reaction control to make the particle sizes non-uniform and cause great loss in subsequent processes due to reaction conditions depending on the amount of particles, which severely reduces the production amount. Particularly, in the case of quantum dots, the particle size has a direct influence on the optical/electrical properties, uniformity in particle diameter is linked directly with the quality of quantum dots and if the non-uniformity exceeds a predetermined limit, the quantum dots lose their unique qualities and become commercially worthless.

U.S. Pat. No. 6,682,596 discloses a process of producing quantum dots by combining reactants with a solvent and continuously passing the combined solution at a selected flow rate through a thermally conductive reaction tube. However, this conventional method still has a problem in that the sizes of quantum dots become non-uniform when the flow rate increases, which restricts mass production.

Technical Problem

The present invention provides an apparatus and method for mass production of quantum dots.

The present invention also provides an apparatus and method for mass producing quantum dots with uniform particle diameters at high yield.

Additional features of the invention will be set forth in the description which follows, and in part will be apparent from the description, or may be learned by practice of the invention.

Technical Solution

In order to achieve the above objects, a quantum dot producing apparatus according to an exemplary embodiment includes a plurality of heating furnaces providing different temperature conditions.

Synthesis of quantum dots through a reactor is done by injecting a large amount of cooled precursors into a high-temperature solvent to create nucleuses, quickly cooling the precursor mixture to stop the nucleation at a proper degree and then again heating the precursor mixture for nuclear growth so as to separate nucleation from nuclear growth. However, this method has difficulties in mass synthesis of quantum dots since it cannot effectively control factors of influencing the particle diameter of quantum dots, such as the injection speed of precursors, the degree of mixing efficiency, the temperature of injected precursors, etc.

A quantum dots producing apparatus using a furnace where a fixed constant temperature is maintained to synthesize quantum dots in continuous processes takes a long time to heat quantum dot nucleuses passed through a mixer to a reaction temperature for nuclear growth due to injection of precursors. During the long heating time, non-uniformity of particles becomes significant. Furthermore, the greater the flow rate, the greater the variations in temperature from the inlet to outlet of the furnace. For these reasons, in order to produce quantum dots of a desired size, a constant growth temperature has to be maintained for an appropriately long period, but the solution containing low-temperature quantum dot nucleuses interferes with maintaining the constant growth temperature. Accordingly, there are difficulties in creating uniform quantum dot nucleuses, and increasing the flow rate makes variations in temperature more significant and also adjustment of reaction conditions difficult.

In general, a temperature range for nucleation of quantum dots partially overlaps a temperature range for nuclear growth, but the temperature range for nucleation is relatively higher than the temperature range for nuclear growth. In the current embodiment, nucleation is separated from nuclear growth by performing nucleation through a heating furnace in a first temperature area and performing nuclear growth through a heating furnace in a second temperature area, which leads to uniformity improvement of particle size.

The quantum dot producing apparatus according to the current embodiment can adjust a temperature in the outlet of the heating furnace for nucleation in the initial operation. Thus, by adjusting the temperature in the outlet to a temperature in the inlet of the next heating furnace, the next heating furnace can easily maintain a uniform temperature over the entire heating area, thus improving temperature uniformity in the nuclear growth area. Consequently, although the quantity of flow increases by increasing the velocity of flow, by adjusting a temperature in the outlet of the first heating area, the second heating area can easily adjust its temperature to a desired degree, which facilitates condition settings for mass production.

The quantum dot producing apparatus according to the current embodiment further includes a buffer disposed between the first heating furnace and the second heating furnace, and passing a solution through the buffer which is at a third temperature that is lower than the first and second temperatures.

The buffer functions to stop the process of quantum dot nucleation such that the process of nucleation is more completely separated from the process of nuclear growth, which further improves uniformity in particle size of quantum dots.

If the two heating areas are configured as separate heating furnaces, the buffer may be simply implemented by exposing a pipe through which a solution flows between the furnaces to the air.

Each heating area may have various temperature gradients. A temperature gradient in each heating furnace may be made depending on an arrangement of heating wires in the heating furnace. Through an optimized arrangement of heating wires for finer temperature adjustment, the nucleation and nuclear growth may occur more effectively.

The mixer for mixing the precursor solutions is heated. The heating temperature may be within a temperature range in which quantum dots are created. Alternatively, the mixer may be positioned in any one of the heating furnaces.

Even when the mixer remains at room temperature, some quantum dot nucleuses are created during the process of mixing the precursor solutions. These unintended quantum dot nucleuses have an adverse effect upon uniformity of particle diameter. In the current embodiment, the mixer is disposed inside the heating furnace so as to perform nucleation uniformly in a short time, thereby further improving uniformity of particle diameter.

The inner space of the mixer may be partitioned into a first heating area and a second heating area that are heated to different temperatures.

Advantageous Effects

According to the quantum dots producing apparatus and method described above, by separating the process for nucleation from the process for nuclear growth using multiple heating areas, it is possible to mass-produce quantum dots with uniform particle diameter.

DESCRIPTION OF DRAWINGS

The accompanying drawings, which are included to provide a further understanding of the invention and are incorporated in and constitute a part of this specification, illustrate embodiments of the invention, and together with the description serve to explain the principles of the invention.

MODE FOR INVENTION

The invention is described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

Figure 1:
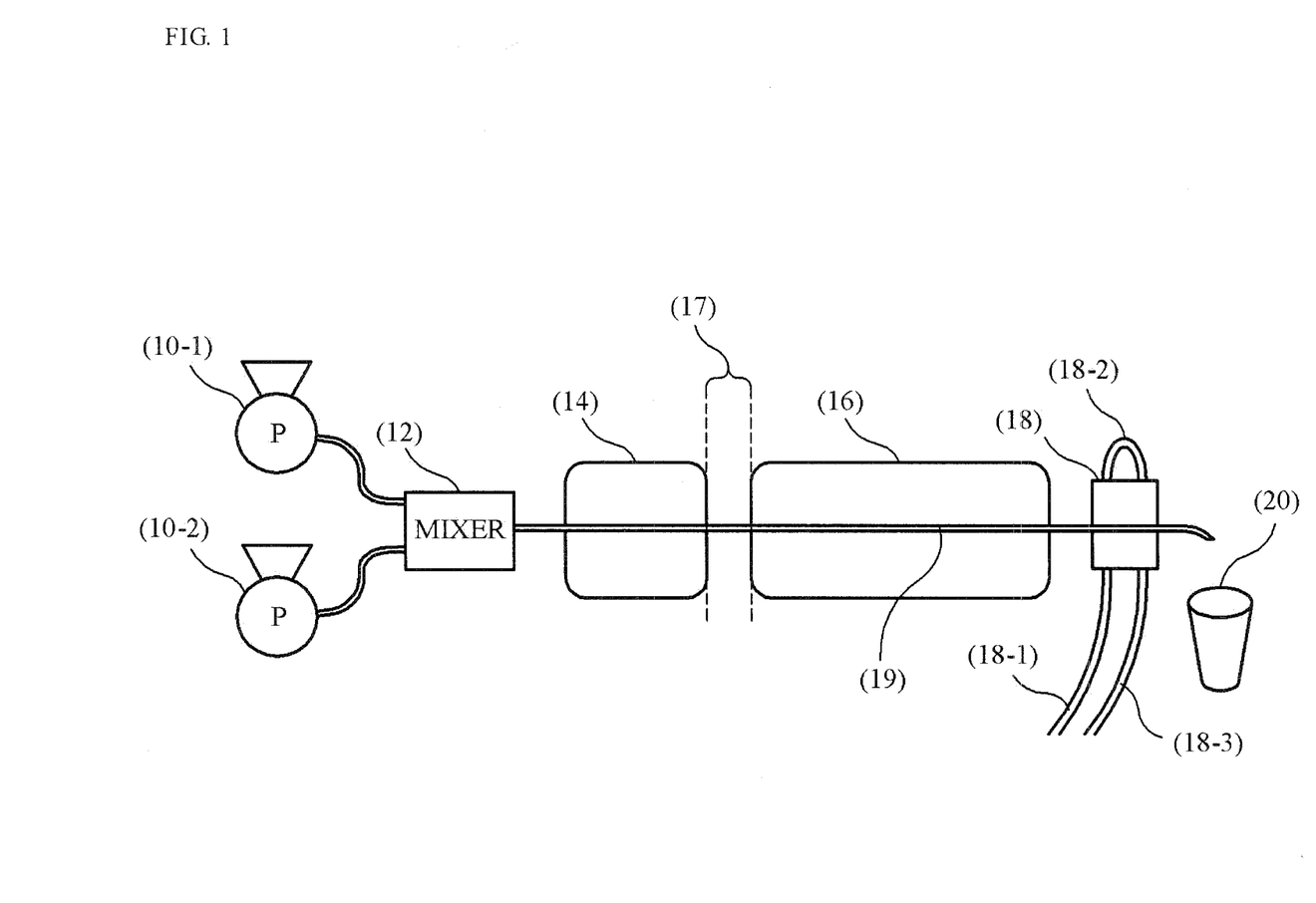
FIG. 1 shows a schematic configuration of a quantum dot producing apparatus according to an exemplary embodiment.

FIG. 1 shows a schematic configuration of a quantum dot producing apparatus according to an exemplary embodiment. Referring to FIG. 1, the quantum dot producing apparatus includes pumps 10-1 and 10-2 for respectively injecting precursor solutions in which different kinds of precursors are dissolved, a mixer 12 where the precursor solutions are mixed, and two heating furnaces 14 and 16 which pass the precursor mixture solution under different temperature conditions respectively.

The heating furnaces include a first heating furnace 14 that is heated to a first temperature for nucleation, and a second heating furnace 16 that is heated to a second temperature for nuclear growth. The heating furnaces 14 and 16 may be implemented as separate heating furnaces or may be implemented as a single heating furnace having two heating areas whose internal temperatures can be independently adjusted.

Specifically, the first heating furnace 14 is shorter than the second heating furnace 16 such that a time period for which the mixture solution passes through the first heating furnace 14 is shorter than that for which the mixture solution passes through the second heating furnace 16.

In the current embodiment, the pumps 10-1 and 10-2 inject the precursor solutions into the mixer 12 at a constant speed. The pumping speed of the pumps 10-1 and 10-2 is not limited to a specific value but may be controlled appropriately for the required purpose.

In the current embodiment, the precursor solutions may be a Cd precursor solution and a Se precursor solution which has been highly commercially utilized in recent years. The Cd precursor solution is made by dissolving Cadmium salt, Squalane and Oleic acid at 150° C. under inert atmospheres of nitrogen or the like in a 3-Neck Round Bottom Flask, reacting the solution for 90 minutes under vacuum conditions of 100° C. to form Cadmium oleate, removing impurities such as water from the Cadmium oleate, then cooling the resultant Cadmium oleate to room temperature to form precursors and then adding Oleylamine into the precursors. The Se precursor solution is prepared by dissolving Selenium shot in Tri-n-octylphosphine to form a TOP Se solution and diluting the TOP Se solution with Squalane.

The Cd and Se precursor solutions are supplied into the mixer 12 through the pumps 10-1 and 10-2. The pumps 10-1 and 10-2 are flow pumps for supplying fluid uniformly. The pumping speed of a flow pump is generally within a range of 0.1-100 ml/min. However, the pumping speed of the pumps 10-1 and 10-12 is not limited to this range.

The two precursor solutions may be supplied from separate pumps or from a single flow pump with a plurality of channels connected to a driving source to supply a constant quantity of flow. The two precursor solutions may be supplied at a constant flow rate or at different flow rates. The precursor proportion in the precursor solutions influences the size or properties of the finally produced quantum dots.

Figure 2:
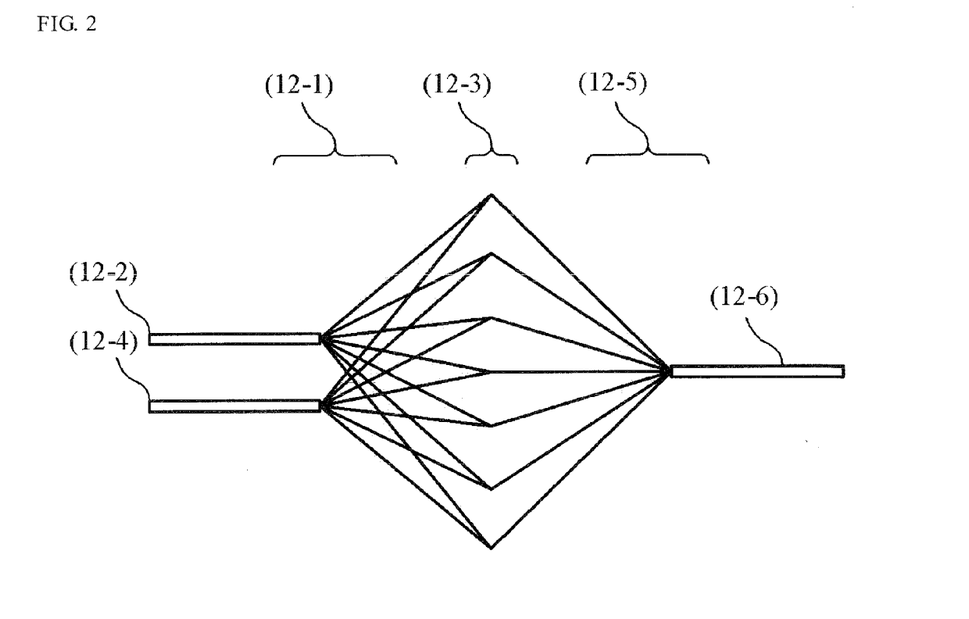
FIG. 2 shows a schematic structure of a mixer according to an exemplary embodiment.

FIG. 2 shows a schematic structure of the mixer 12 according to an exemplary embodiment. As shown in FIG. 2, the mixer 12 has a structure where a plurality of paths diverge from each of two input ports 12-2 and 12-4 to which the two precursor solutions are respectively supplied, the diverging paths joining with other paths diverging from the other one of the two input ports 12-2 and 12-4, and then the joined paths are collected into an output port 12-6.

The plurality of paths, which are pipes (hereinafter, referred to as micro pipes) diverging from the input ports 12-2 and 12-4, are under the same hydrodynamical conditions.

Accordingly, precursor solutions injected through the input ports 12-2 and 12-4 are divided into a plurality of streams having the same flow rate. Each micro pipe has a diameter of several microns, for example, about 2.5 μm. Micro pipes diverging from one of the input ports 12-2 and 12-4 join one by one with micro pipes diverging from the other of the input ports 12-2 and 12-4. In the area 12-3 where the micro pipes join with each other, the streams of the precursor solutions are mixed.

In order to facilitate the mixing in the mixing area 12-3, the micro pipes may be twisted before the front part of the mixing area 12-3 to form turbulence in the precursor solutions near the mixing area 12-3. In addition, it is also important to ensure the maximum cross-section of an area where two pipes join with each other by minimizing the angle at which the two pipes meet. The pipes joining in the mixing area 12-3 are collected into the output port 12-6 (the collecting area is denoted by 12-5 in FIG. 2). Since the two precursor solutions have already been mixed sufficiently in the mixing area 12-3, the collecting area 12-5 does not need to have any special structure for mixing.

The term "pipe" used in this specification has to be interpreted to include any structure capable of controlling the flow of fluid while passing it therethrough, as well as a tube-shaped pipe. For example, the pipe may have a structure manufactured by patterning the facing sides of two metal plates and then bonding them.

Micro pipes that are manufactured by patterning metal plates are more effective.

A pipe 19 joined to the output port 12-6 of the mixer 12 is made of a material with high thermal conductivity such as copper. The pipe 19 traverses the first heating furnace 14, the second heating furnace 16 and a cooling unit 18. In FIG. 1, the pipe 19 has a linear structure, but may have a spiral shape or any other curved shape to improve the efficiency of heating or cooling.

In the current embodiment illustrated in FIG. 1, the first heating furnace 14 and the second heating furnace 16 have the same width but the second heating furnace 16 is much longer than the first heating furnace 14. The first heating furnace 14 provides a high-temperature condition and accordingly the mixture solution passing through the first heating furnace 14 is exposed to a high temperature for a short time. This short-time heating is effective in making particle diameters uniform since nucleation occurs for a very short time. The second heating furnace 16 provides a relatively low temperature condition. Quantum dot nucleuses created in the first heating furnace 14 are grown in the second heating furnace 16 by precursors remaining in the solution. The time for which the solution stays in the second heating furnace 16 has a direct influence on the mean diameter of finally produced quantum dots.

The present inventors found the fact that nucleation continuously occurring during growth of quantum dot nucleus is a major factor making the diameters of quantum dots non-uniform. Thus, the present inventors have made an effort to maximally separate nucleation from nuclear growth.

According to another exemplary embodiment, the quantum dot producing apparatus further includes a buffer 17 between the first heating furnace 14 and the second heating furnace 16, which passes the solution therethrough at a third temperature that is lower than the first and second temperatures. In the current embodiment, the buffer 17 may be simply implemented as an area where the pipe 19 is exposed in the air between the first and second heating furnaces 14 and 16. While the precursor solution passes through the buffer 17, the solution is exposed to room temperature and accordingly nucleation is substantially stopped. Due to the provision of the buffer 17, nucleation is more completely separated from nuclear growth. However, the buffer 17 may be a low-temperature heating unit, or an air-cooled type or water-cooled type cooler.

Growth of the quantum dots grown to a desired size in the second heating furnace 16 is completely stopped when they pass through the cooling unit 18. The cooling unit 18 is a water-cooled type that supplies circulating water jackets through pipes 18-1, 18-2 and 18-3 to dissipate heat. However, the cooling unit 18 is not limited to this and may be any other type such as an air-cooled type. The solution containing finally produced quantum dots is discharged to a container 20.

Figure 3:
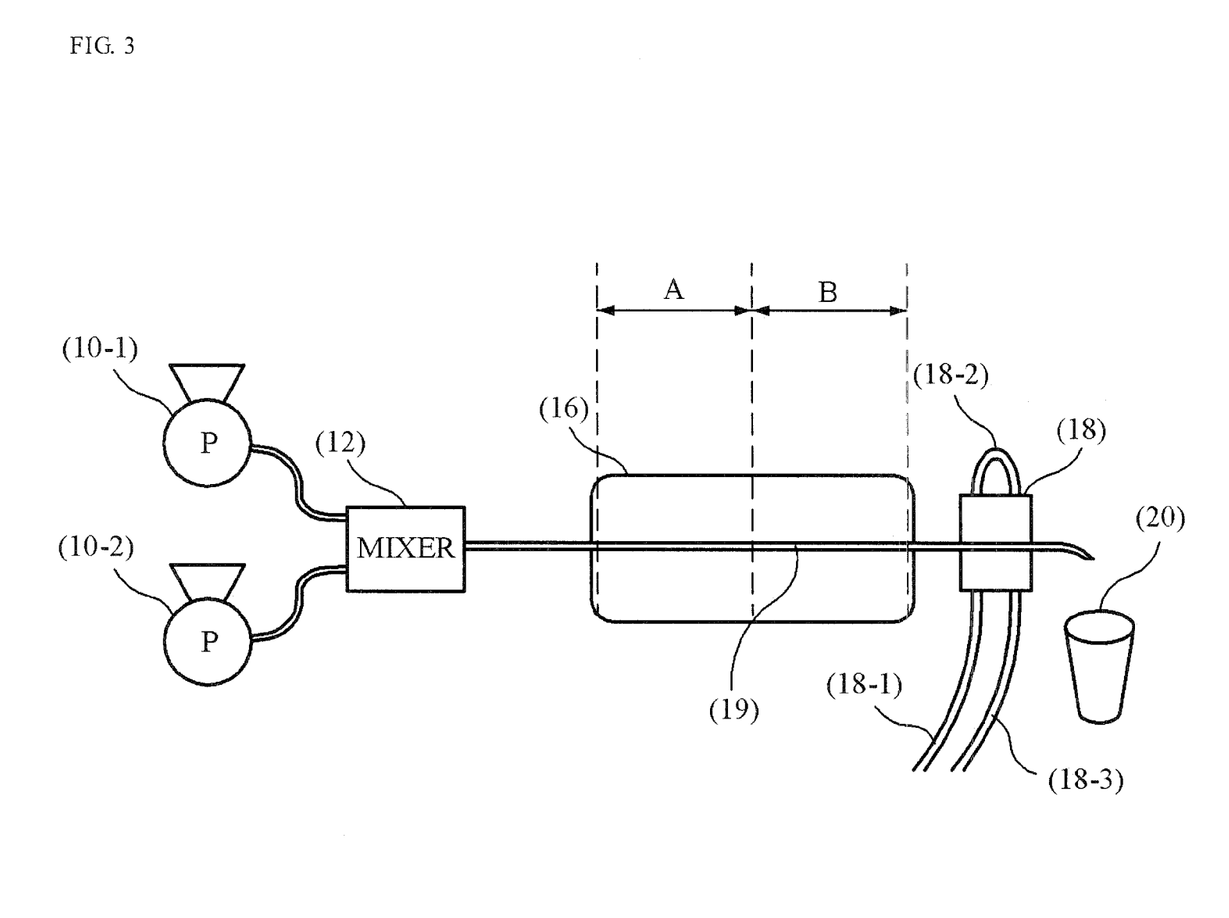
FIG. 3 shows a schematic configuration of a quantum dot producing apparatus according to another exemplary embodiment.

FIG. 3 shows a schematic configuration of a quantum dot producing apparatus according to another exemplary embodiment. As illustrated in FIG. 3, the quantum dot producing apparatus includes pumps 10-1 and 10-2 for respectively injecting precursor solutions in which different kinds of precursors are dissolved, a mixer 12 where the precursor solutions are mixed, a first heating part A which passes the mixture solution therethrough under a first temperature condition to create a plurality of quantum dot nucleuses, and a second heating part B which passes the mixture solution therethrough under a second temperature condition to grow the quantum dot nucleus by remainder precursor existing in the solution. In the current embodiment, the pumps 10-1 and 10-2 rotate at a constant speed to provide a constant quantity of flow. However, the pumping speed of the pumps 10-1 and 10-2 is not limited to a specific value and may be controlled appropriately for the required purpose.

Comparing the current embodiment with the embodiment illustrated in FIG. 1, the current embodiment provides a single heating furnace 16 unlike the embodiment of FIG. 1. In this specification, the expression "including a plurality of heating areas or a plurality of heating furnaces" is defined to include both the case of providing visually or physically a single heating furnace with a plurality of partitioned or non-partitioned blocks each allowing independent temperature control and the case of configuring physically a plurality of heating furnaces. For example, in the case of physically providing a single heating furnace with two heating-wire groups independently arranged, the heating furnace can be considered to be two heating units capable of providing a first heating area that is under a first temperature condition and a second heating area that is under a second temperature condition.

In the current embodiment, the heating furnace 16 has heating-wire groups arranged independently to provide a first heating part A corresponding to a first heating area and a second heating part B corresponding to a second heating area. In order to enforce thermal independency of the two heating parts 16-1 and 16-2, a heat insulator partition may be provided between the first heating parts 16-1 and 16-2 in the heating furnace 16.

Except for this physical difference, the embodiment of FIG. 3 is similar to the embodiment of FIG. 1. Likewise, the first heating part A is maintained at a higher temperature than the second heating part B. Also, the first heating part A is shorter in a pipe direction than the second heating part B. The lengths of the first and second heating parts A and B influence the particle diameter of finally produced quantum dots.

A heating temperature of the first heating part A may be within a range from 170° C. to 380° C. and a heating temperature of the second heating part B may be within a range from 260° C. to 350° C. However, the heating temperatures may be within an arbitrary different temperature range. Creation of quantum dot nucleuses generally requires a higher temperature than that required for growth of quantum dot nucleuses.

Figure 4:
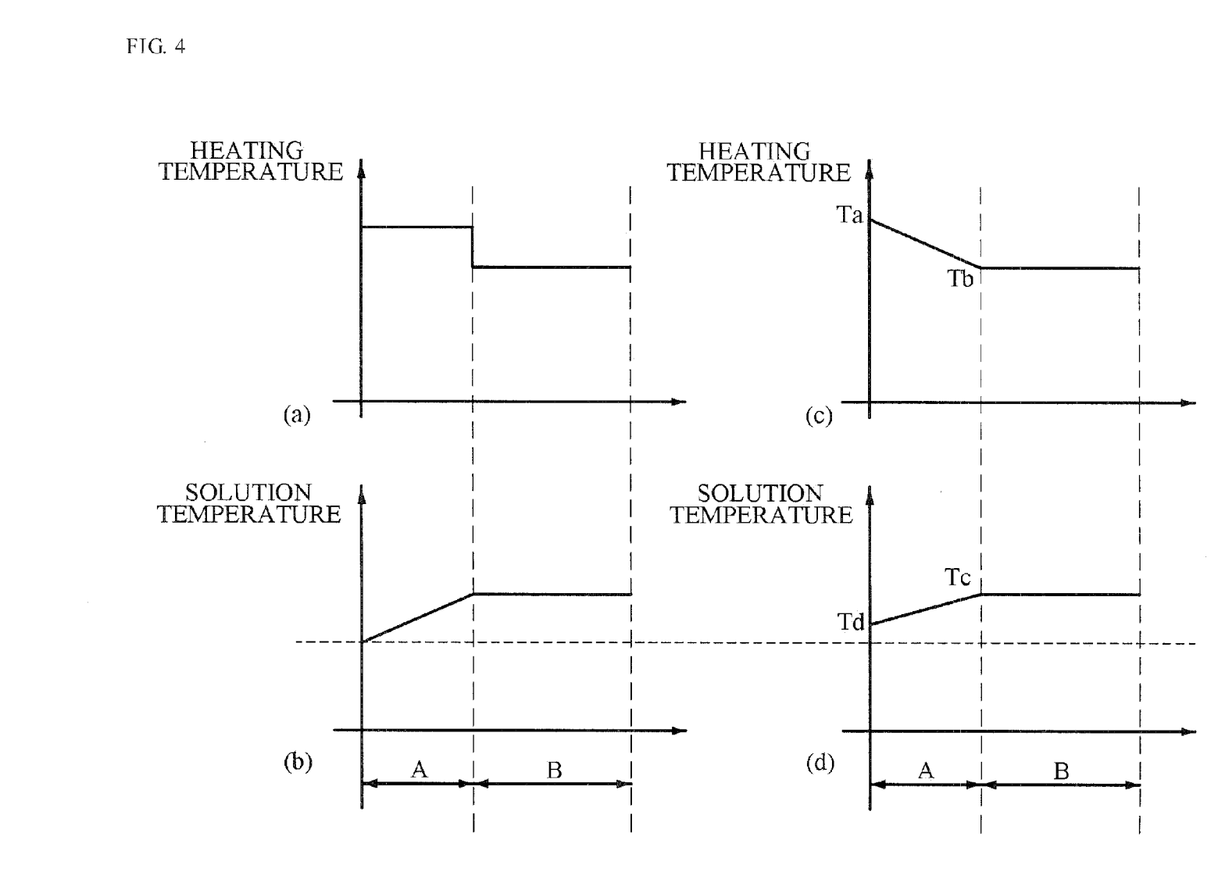
FIG. 4 shows graphs for explaining temperature control within the quantum dot producing apparatus illustrated in FIG. 3.

FIG. 4 shows graphs for explaining temperature control within the quantum dots producing apparatus illustrated in FIG. 3.

FIG. 4 shows temperature changes (a) and (c) in the respective heating parts A and B and temperature changes (b) and (d) of a solution in the pipe due to the temperature changes (a) and (c) of the heating parts A and B. (b) of FIG. 4 is a plot showing a temperature change of the solution in the pipe when the temperatures of the heating parts A and B follow the graph (a) of FIG. 4. In the example of temperature control shown in (a) of FIG. 4, the heating unit A is heated to a high temperature and is relatively short. Accordingly, the precursor mixture solution is exposed to a high temperature for a short time. Since nucleation occurs in a shorter time than nuclear growth, the temperature control is effective in achieving uniformity of particle diameter. The second heating part B is heated to a relatively low temperature and is relatively long. The quantum dot nucleuses created in the first heating part A are grown by remaining precursors existing in the solution while passing through the second heating part B. The time for which the solution stays in the second heating part B has a direct influence on the mean diameter of finally produced quantum dots.

Since the temperature of a solution flowing into the first heating part A gradually increases although the first heating part A is maintained at a high-temperature, the temperature of the solution in the outlet of the first heating part A reaches the temperature of the second heating part B or slightly below the temperature of the second heating part B. If a temperature of the outlet of the first heating part A is adjusted to a reaction temperature of quantum dots, the second heating part B may be heated only to a temperature degree lower than the temperature of the first heating part A to maintain the reaction temperature. Through this configuration, the temperature of a solution flowing into the second heating part B is maintained constant, which facilitates adjustment of a speed of quantum dot growth, that is, adjustment of diameter uniformity of finally produced quantum dots. For example, by curving a pipe passing through the second heating part B to lengthen a heating area in the second heating part B, mass production of quantum dots having a tailored yet uniform size can be achieved.

A temperature change of a solution in the heating parts A and B when the temperature of the heating parts A and B varies as illustrated in (c) of FIG. 4 is shown in (d) of FIG. 4. In the current embodiment of temperature control, each heating part (for example, the first heating part A) has a temperature gradient instead of having a constant temperature. The temperature gradient controls a temperature distribution to cause a solution flowing into the inlet of the heating part A to reach a desired temperature in a short time.

Figure 5:
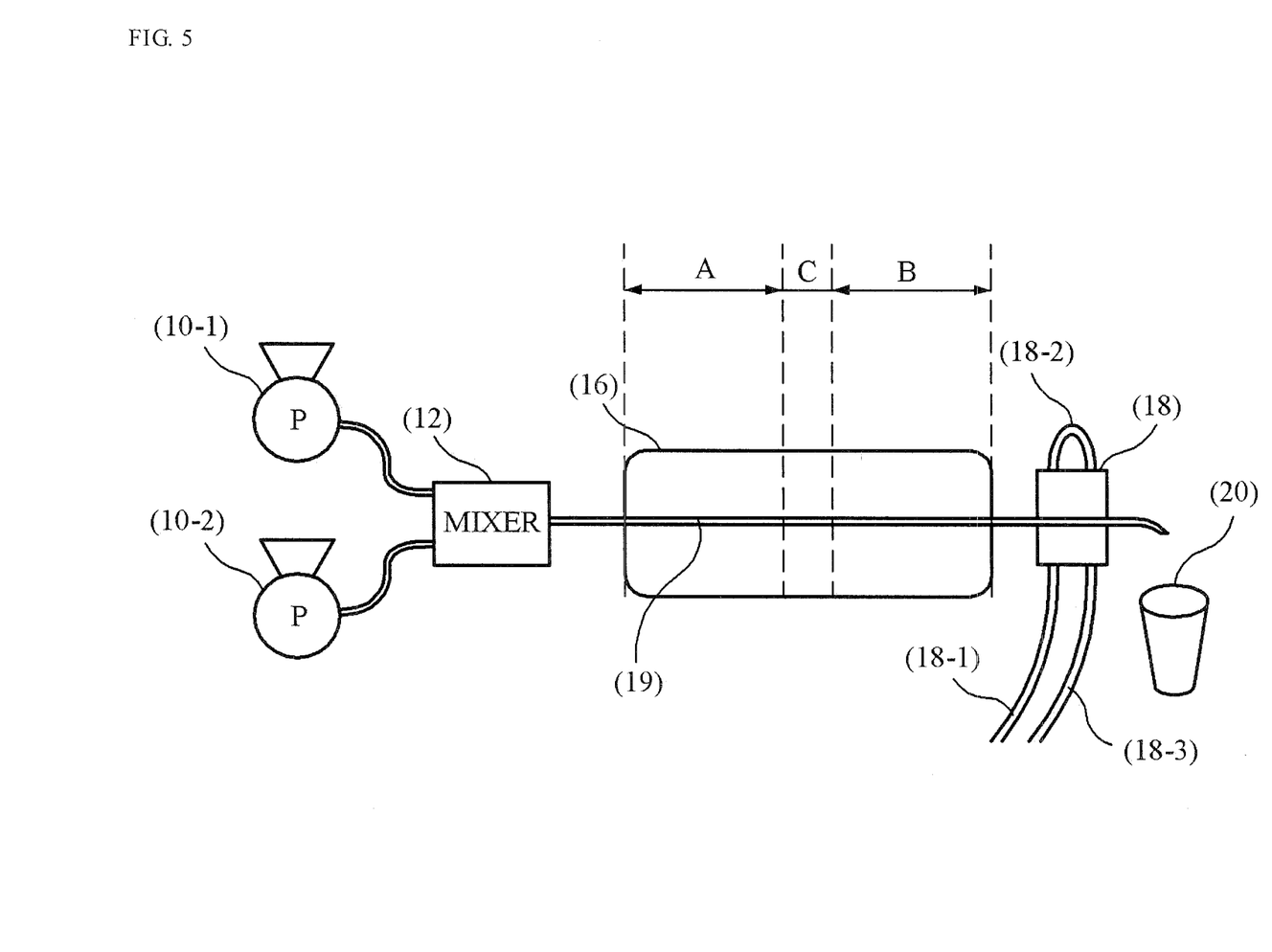
FIG. 5 shows a schematic configuration of a quantum dot producing apparatus according to another exemplary embodiment.

FIG. 5 shows a schematic configuration of a quantum dot producing apparatus according to another exemplary embodiment. Comparing the embodiment of FIG. 5 with the embodiment of FIG. 3, the embodiment of FIG. 5 is different from the embodiment of FIG. 3 in that a buffer area C is provided between first and second heating areas A and B in a heating furnace 16. The provision of the buffer area is aimed at precise control on production of quantum dots by separating nucleation from nuclear growth.

Figure 6:
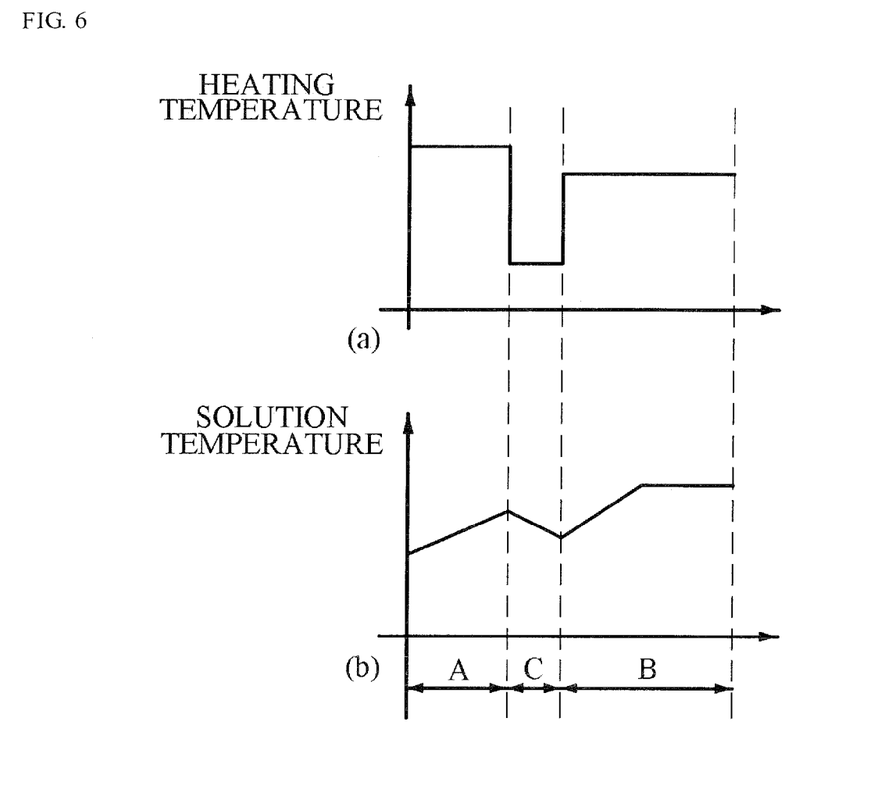
FIG. 6 shows graphs for explaining exemplary temperature control within the quantum dot producing apparatus illustrated in FIG. 5.

FIG. 6 shows graphs for explaining exemplary temperature control within the quantum dots producing apparatus illustrated in FIG. 5. In the current embodiment, the first heating part A maintains a higher temperature than the second heating part B, thus causing a solution flowing into the first heating part A to quickly reach a target temperature. In addition, if nucleuses are created in the first heating part A that is a short area with high-temperature conditions, the buffering area C lowers the temperature to prevent additional nucleation. A temperature of a solution present in the buffer area C may be lower than a reaction temperature required for nucleation. In the second heating part B which is a long area with relatively low-temperature conditions, the created nucleuses are grown by remaining precursors.

Figure 7:
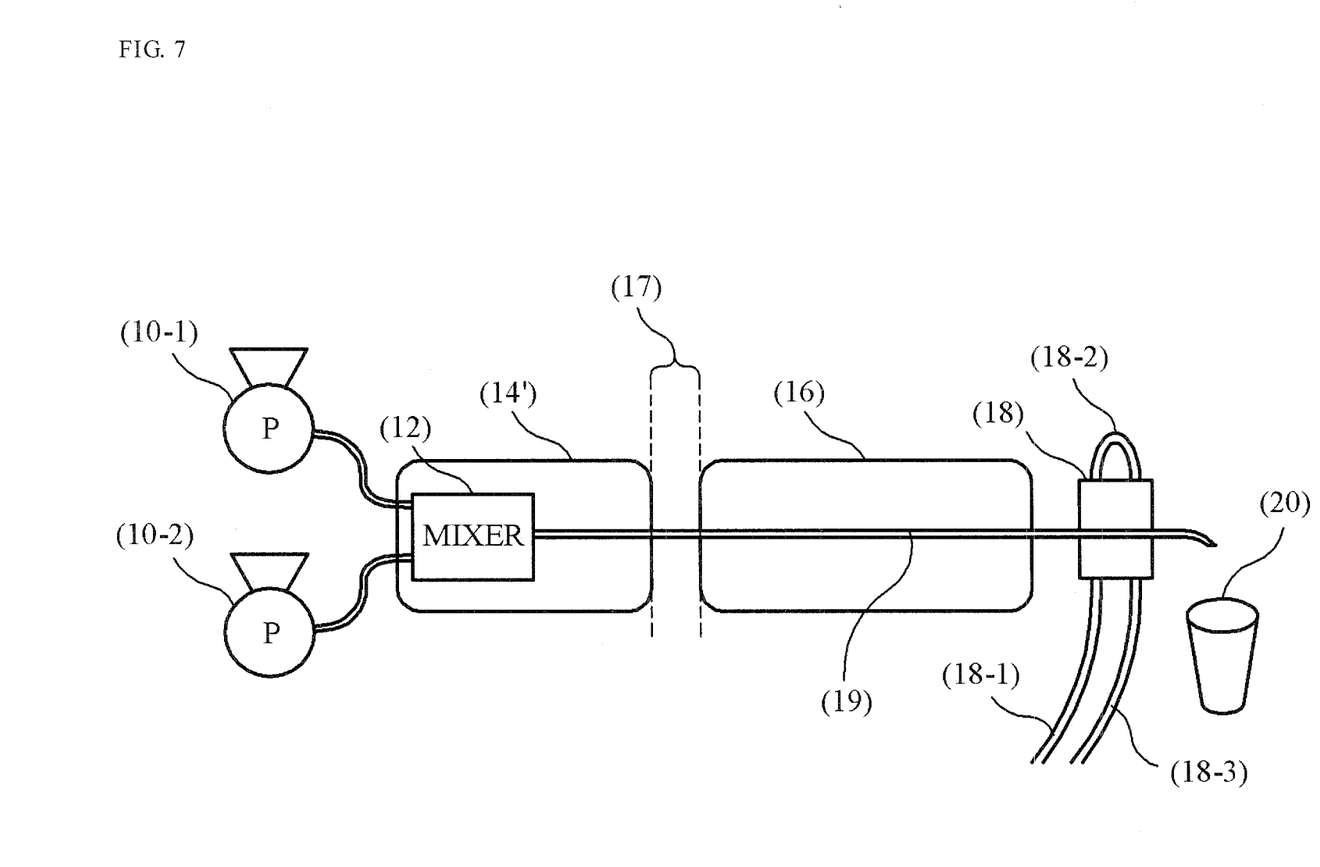
FIG. 7 shows a schematic configuration of a quantum dot producing apparatus according to another exemplary embodiment.

FIG. 7 shows a schematic configuration of a quantum dot producing apparatus according to another exemplary embodiment. In FIG. 7, like reference numerals in FIG. 1 denote like elements. As illustrated in FIG. 7, the quantum dot producing apparatus further includes a mixer heating unit 14' which surrounds a mixer 12 to heat the mixer 12 to a predetermined temperature. In the current embodiment, the mixer heating unit 14' corresponds to a first heating part 14' and the mixer 12 is placed in the first heating part 14'. However, it is also possible that the mixer heating unit and the first heating part are provided as separate heating elements. As another example, the mixer heating unit 14' may be implemented as heat wires installed inside the mixer 12.

While the mixer 12 mixes precursor solutions, quantum dot nucleuses may be created even at room temperature. In the current embodiment, since the mixer 12 is maintained at a high temperature inside the first heating part 14', relatively constant temperature conditions are maintained from when the two precursor solutions are mixed to when the mixture solution exits the first heating part 14', which further improves diameter uniformity of nucleuses.

Figure 8:
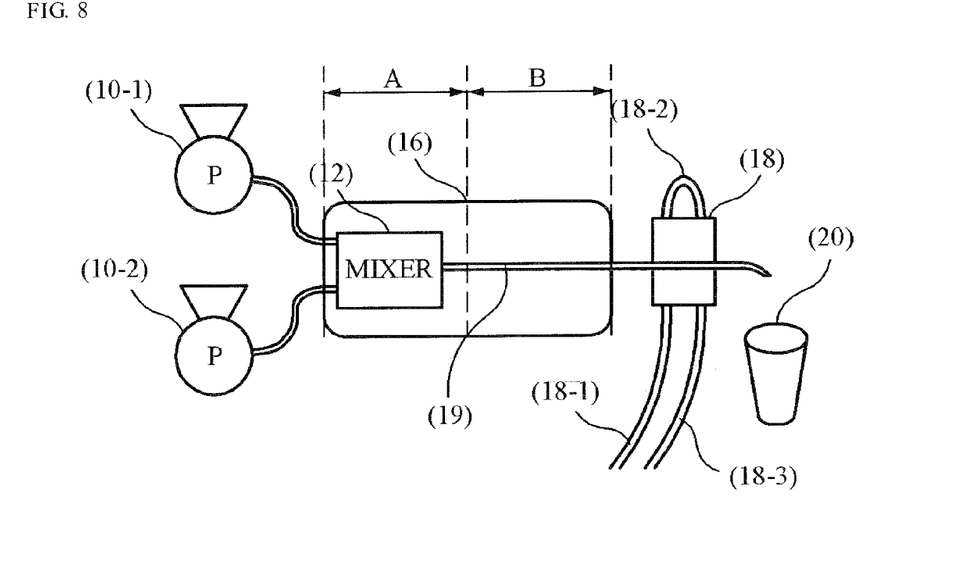
FIG. 8 shows a schematic configuration of a quantum dot producing apparatus according to another exemplary embodiment.

FIG. 8 shows a schematic configuration of a quantum dot producing apparatus according to another exemplary embodiment. In FIG. 8, like reference numerals in FIG. 1 denote like elements. In the quantum dots producing apparatus, a heating furnace 16 surrounds a mixer 12 to heat the mixer 12 to a predetermined temperature. The heating furnace 16 is thermally partitioned into a first heating part A and a second heating part B that are independently temperature-controlled. A low-temperature buffer area may be provided between the first and second heating parts A and B.

In the current embodiment, the mixer 12 is installed inside the heating furnace 16, however it may be more effective if a heating furnace is implemented in a mixer by arranging heat wires surrounding the frame of the mixer.

Like the above-described embodiment illustrated in FIG. 3 or 5, the heating furnace 16 is divided into two heating parts including a first heating part A and a second heating part B that are thermally independent from each other. In order to enforce the thermal independency, a heat insulator partition may be provided between the first heating parts A and B.

While the mixer 12 mixes precursor solutions, quantum dot nucleuses may be created even at room temperature. In the current embodiment, since the mixer 12 is maintained at a high temperature inside the heating furnace 16, relatively constant temperature conditions are maintained from when the two precursor solutions are mixed to when the mixture solution exits the heating furnace 16, which further improves diameter uniformity of the nucleuses than the embodiments described above with reference to FIGS. 1 and 3.

Figure 9:
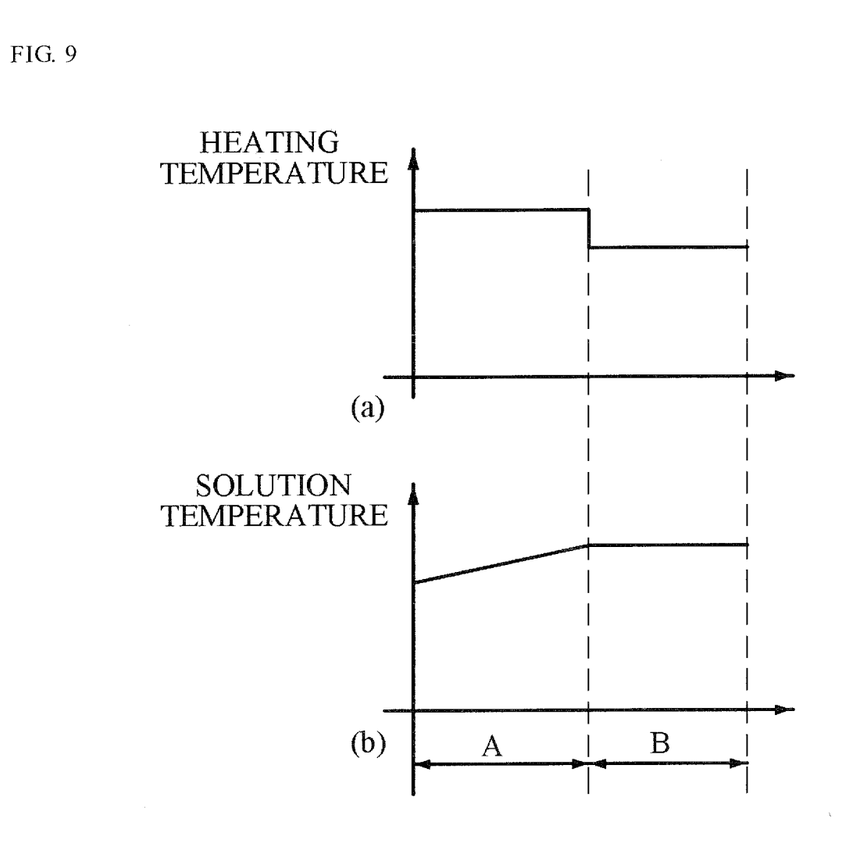
FIG. 9 shows graphs for explaining exemplary temperature control within the quantum dot producing apparatus illustrated in FIG. 8.

FIG. 9 shows graphs for explaining temperature control within the quantum dots producing apparatus illustrated in FIG. 8. As seen in FIG. 9, two precursor solutions are already close to a temperature necessary for nucleation when they are mixed and accordingly nucleation occurs immediately throughout the first heating part A. The created nucleuses are grown uniformly at a constant temperature in the second heating part B. In order to heat each heating part to a target temperature in a short time, each heating part (for example, the first heating part A) may be controlled to have a temperature gradient.

In the embodiment illustrated in FIG. 1 or 7, the heating furnaces are physically independent from other elements and this provides assembly convenience during the manufacturing process.

Hereinafter, a quantum dot producing method according to an exemplary embodiment will be described. The quantum dots producing method includes: pumping a plurality of precursor solutions in which different kinds of precursors are dissolved to supply the plurality of precursor solutions; mixing the plurality of precursor solutions; and heating the mixture solution by passing the mixture solution through a plurality of heating furnaces that have different temperature conditions.

The heating operation includes: heating the mixture solution to a first temperature while passing the mixture solution through a first heating furnace to create quantum dot nucleuses; and heating the mixture solution to a second temperature while passing the mixture solution through a second heating furnace to grow the quantum dot nucleuses using precursors remaining in the mixture solution.

In the current embodiment, the precursor solutions are supplied at a constant flow rate. The constant flow rate means that a pumping speed is constant. However, it is also possible to vary the flow rate depending on the shape of quantum dots to be produced or depending on process purpose.

It is preferable that a first temperature for nucleation is higher than a second temperature for nuclear growth and nucleation occurs in a shorter time than nuclear growth does. Also, between the nucleation and nuclear growth operations, a buffering operation may be provided which exposes a solution to a third temperature lower than the first and second temperatures to cool the solution.

According to another embodiment, the mixing operation may be carried out while heating the solution to a predetermined temperature.

Figure 10:
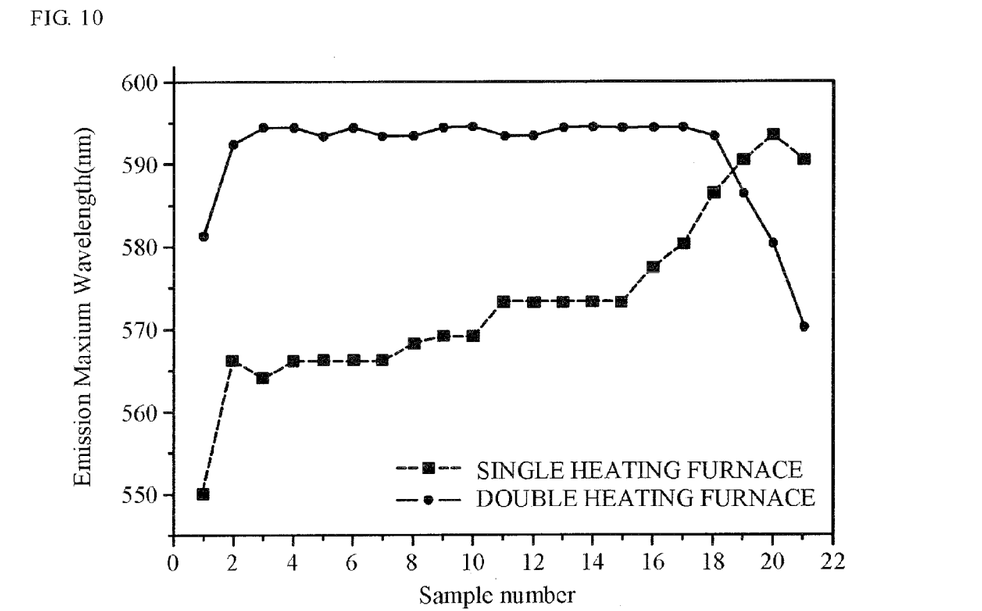
FIGS. 10 and 11 are graphs showing experimental results with respect to synthesis of quantum dots to compare the case of separating nucleation from nuclear growth with the case of not separating nucleation from nuclear growth.
Figure 11:
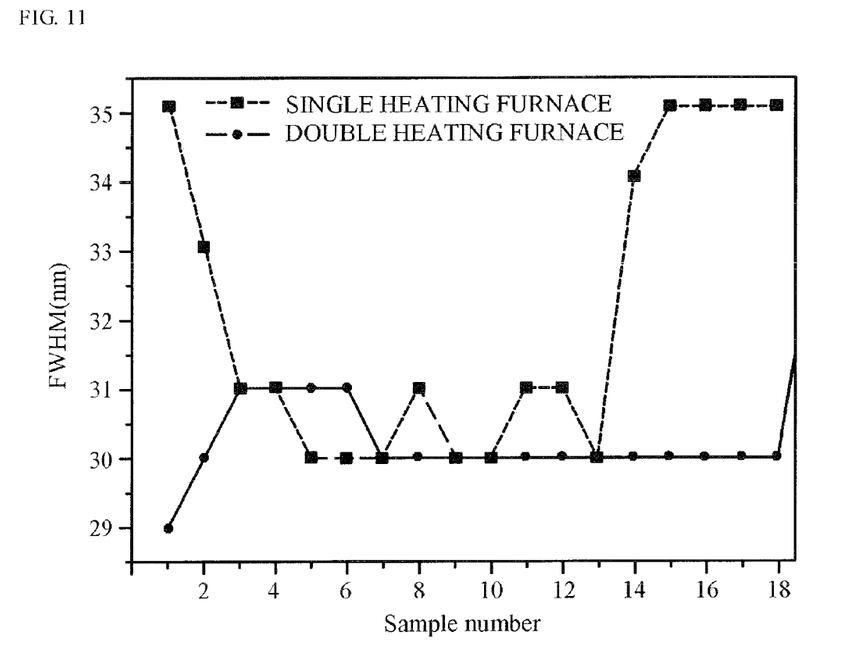

FIGS. 10 and 11 are graphs showing experimental results with respect to synthesis of quantum dots to compare the case of separating nucleation from nuclear growth with the case of not separating nucleation from nuclear growth.

In FIG. 11, a solid line graph shows a change of particle diameter in the case of continuously reacting a Cd solution with a Se solution in the ratio of 1:1 at a flow rate of 1 ml/min at 300° C. using a heating furnace with a single heating area which does not to separate nucleation from nuclear growth. As seen in this solid line graph, as reaction proceeds, the particle diameter increases. In the embodiment shown in FIG. 1, the first heating furnace relating to nucleation is maintained at 350° C. and the second heating furnace relating to nuclear growth is maintained at 300° C. FIG. 10 shows the measurement results on the emission maximum wavelength of 21 samples with respect to the case of using a single heating furnace and the case of using two heating furnaces. The emission wavelength of quantum dots relates to the particle diameter. Non-uniformity of the emission wavelengths of samples means irregularity of particle diameters. As seen in FIG. 10, the degree of non-uniformity of particle diameters is far higher in the case where nucleation is not separated from nuclear growth. Also, it can be seen in FIG. 10 that in the case of separating nucleation from nuclear growth, excellent uniformity of particle diameters is achieved.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

The invention claimed is:

1. An apparatus of producing quantum dots, comprising:
at least one pump to inject a plurality of precursor solutions in which different kinds of precursors are dissolved;
a mixer to mix the plurality of precursor solutions into a mixture solution, the mixer including a first input port diverging into a first plurality of first paths, a second input port diverging into a second plurality of second paths, and an output port having a third plurality of third paths collecting into the output port, wherein each of the first and second paths is connected to a third path;
a plurality of heating furnaces to pass the mixture solution therethrough under different temperature conditions, the plurality of heating furnaces including a first heating furnace to provide a first temperature condition for nucleation, and a second heating furnace to provide a second temperature condition for nuclear growth, and
a buffer disposed between the first heating furnace and the second heating furnace and passing the mixture solution through the buffer to provide a third temperature condition,
wherein the first temperature is higher than the second temperature, and the second temperature is higher than the third temperature.

2. The apparatus of claim 1, wherein the first heating furnace is shorter than the second heating furnace such that a time period for which the mixture solution passes through the first heating furnace is shorter than a time period for which the mixture solution passes through the second heating furnace.

3. The apparatus of claim 1, further comprising a cooling unit to cool the mixture solution discharged from the second heating furnace.

4. The apparatus of claim 1, wherein at least one of the plurality of heating furnaces has a temperature gradient in a direction in which the mixture solution passes therethrough.

5. The apparatus of claim 1, further comprising a mixer heating unit surrounding the mixer to heat the mixer to a predetermined temperature.

6. The apparatus of claim 5, wherein the first heating furnace acts as the mixer heating unit and the mixer is positioned in the first heating furnace.

7. The apparatus of claim 6, wherein the mixer heating unit has a temperature gradient in a direction in which the mixture solution passes therethrough.

8. A method of producing quantum dots, comprising:
pumping a plurality of precursor solutions in which different kinds of precursors are dissolved to supply the plurality of precursor solutions;
mixing the plurality of precursor solutions into a mixture solution, the mixer including a first input port diverging into a first plurality of first paths, a second input port diverging into a second plurality of second paths, and an output port having a third plurality of third paths collecting into the output port, wherein each of the first and second paths is connected to a third path;
heating the mixture solution by passing the mixture solution through a plurality of heating furnaces that provide different temperature conditions; and
passing the mixture solution through a third temperature condition wherein the heating comprises:

heating the mixture solution to the first temperature while passing the mixture solution through a first heating furnace, thus creating a plurality of quantum dot nucleuses; and heating the mixture solution to a second temperature while passing the mixture solution through a second heating furnace, thus growing the plurality of quantum dot nucleuses using precursors remaining in the mixture solution, wherein the first temperature is higher than the second temperature, and the second temperature is higher than the third temperature.

9. The method of claim 8, wherein the creating of the quantum dot nucleuses occurs in a shorter time than that of growing of the quantum dot nucleuses.

10. The method of claim 8, wherein in the heating of the mixture solution, the mixture solution has a temperature gradient in a direction in which the mixture solution passes through at least one of the plurality of heating furnaces.

11. The method of claim 8, further comprising cooling the mixture solution after the heating of the mixture solution.

12. The method of claim 8, wherein the mixing of the plurality of precursor solutions is performed while heating the plurality of precursor solutions to a predetermined temperature.

13. The apparatus of claim 1, further comprising a cooling unit to cool the mixture solution discharged from the second heating furnace.

14. The apparatus of claim 1, further comprising a mixer heating unit surrounding the mixer to heat the mixer to a predetermined temperature.

15. The method of claim 8, further comprising cooling the mixture solution after the heating of the mixture solution.

16. The method of claim 10, further comprising cooling the mixture solution after the heating of the mixture solution.

\* \* \* \* \*